United States Patent
Chen et al.

(10) Patent No.: US 7,745,351 B2
(45) Date of Patent: Jun. 29, 2010

(54) POST DEPOSITION PLASMA TREATMENT TO INCREASE TENSILE STRESS OF HDP-CVD SIO$_2$

(75) Inventors: Xiaolin Chen, San Jose, CA (US); Srinivas D. Nemani, Sunnyvale, CA (US); DongQing Li, Fremont, CA (US); Jeffrey C. Munro, Santa Clara, CA (US); Marlon E. Menezes, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 121 days.

(21) Appl. No.: 12/252,260

(22) Filed: Oct. 15, 2008

(65) Prior Publication Data
US 2009/0035918 A1 Feb. 5, 2009

Related U.S. Application Data

(62) Division of application No. 11/221,303, filed on Sep. 7, 2005, now Pat. No. 7,465,680.

(51) Int. Cl.
*H01L 21/31* (2006.01)
*H01L 21/469* (2006.01)
(52) U.S. Cl. .................. 438/788; 438/782; 438/798; 257/E21.241
(58) Field of Classification Search ............ None
See application file for complete search history.

(56) References Cited

U.S. PATENT DOCUMENTS 4,962,049 A 10/1990 Chang et al.

(Continued)

FOREIGN PATENT DOCUMENTS

EP 1 186 685 A2 3/2002

(Continued)

OTHER PUBLICATIONS

Office Action of U.S. Appl. No. 11/221,303, mailed Jan. 16, 2008.

(Continued)

*Primary Examiner*—Jarrett J Stark
(74) *Attorney, Agent, or Firm*—Townsend and Townsend and Crew

(57) ABSTRACT

Methods of forming a dielectric layer where the tensile stress of the layer is increased by a plasma treatment at an elevated position are described. In one embodiment, oxide and nitride layers are deposited on a substrate and patterned to form an opening. A trench is etched into the substrate. The substrate is transferred into a chamber suitable for dielectric deposition. A dielectric layer is deposited over the substrate, filling the trench and covering mesa regions adjacent to the trench. The substrate is raised to an elevated position above the substrate support and exposed to a plasma which increases the tensile stress of the substrate. The substrate is removed from the dielectric deposition chamber, and portions of the dielectric layer are removed so that the dielectric layer is even with the topmost portion of the nitride layer. The nitride and pad oxide layers are removed to form the STI structure.

20 Claims, 7 Drawing Sheets

U.S. PATENT DOCUMENTS

| | | |
|---|---|---|
| 5,194,118 A | 3/1993 | Shinohara |
| 5,681,425 A | 10/1997 | Chen |
| 5,707,485 A | 1/1998 | Rolfson et al. |
| 5,820,723 A | 10/1998 | Benjamin et al. |
| 5,948,704 A | 9/1999 | Benjamin et al. |
| 6,037,237 A | 3/2000 | Park et al. |
| 6,287,977 B1 | 9/2001 | Hashim et al. |
| 6,514,870 B2 | 2/2003 | Rossman |
| 6,528,427 B2 | 3/2003 | Chebi et al. |
| 6,559,061 B2 | 5/2003 | Hashim et al. |
| 6,709,987 B2 | 3/2004 | Hashim et al. |
| 6,781,086 B2 | 8/2004 | Choi |
| 6,974,768 B1 | 12/2005 | Kailasam |
| 2002/0139388 A1 | 10/2002 | Chebi et al. |
| 2002/0177329 A1 | 11/2002 | Yang et al. |
| 2004/0063300 A1 | 4/2004 | Chi |
| 2004/0084146 A1 | 5/2004 | Sekiya |
| 2004/0149386 A1 | 8/2004 | Numasawa et al. |
| 2004/0248395 A1 | 12/2004 | Yoneda et al. |
| 2005/0181598 A1 | 8/2005 | Kailasam |
| 2006/0105106 A1 | 5/2006 | Balseanu et al. |
| 2007/0068455 A1 | 3/2007 | Bolden, II |

FOREIGN PATENT DOCUMENTS

| | | |
|---|---|---|
| JP | 56-138916 A | 10/1981 |
| JP | 06-333922 A | 12/1994 |

OTHER PUBLICATIONS

Office Action of U.S. Appl. No. 11/221,303, mailed Jun. 6, 2008.

Notice of Allowance of U.S. Appl. No. 12/221,303, mailed Oct. 8, 2008.

Ramkumar et al., "Stress in SI02 Films Deposited by Plasma and Ozone Tetraethylorthosilicate Chemical Vapor Deposition Processes," *Journal of Electromechanical Society*, vol. 139, No. 5, May 1, 1992, pp. 1437-1442.

Thurn et al., "Stress Hysteresis and Mechanical Properties of Plasma-Enhanced Chemical Vapor Deposited Dielectric Films," *Journal of Applied Physics, American Institute of Physics*, vol. 95, No. 3, Feb. 1, 2004, pp. 967-976.

POST DEPOSITION PLASMA TREATMENT TO INCREASE TENSILE STRESS OF HDP-CVD SIO$_2$

CROSS-REFERENCES TO RELATED APPLICATIONS

This application is a division of U.S. patent application Ser. No. 11/221,303, filed on Sep. 7, 2005, the entire disclosure of which is incorporated herein by reference in its entirety for all purposes.

BACKGROUND OF THE INVENTION

One of the primary steps in the fabrication of modern semiconductor devices is the formation of a thin layer on a semiconductor substrate by chemical reaction of gases. Such a deposition process is referred to generally as chemical-vapor deposition ("CVD"). Conventional thermal CVD processes supply reactive gases to the substrate surface where heat-induced chemical reactions take place to produce a desired layer. Plasma-enhanced CVD ("PECVD") techniques, on the other hand, promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes as compared to conventional thermal CVD processes. These advantages are further exploited by high-density-plasma ("HDP") CVD techniques, in which a dense plasma is formed at low vacuum pressures so that the plasma species are even more reactive. "High-density" is understood in this context to mean having an ion density that is equal to or exceeds $10^{11}$ ions/cm$^3$.

During a conventional chemical vapor deposition process, the substrate remains on the surface of the pedestal or support structure for the duration of the deposition and is then lifted off the pedestal by a lifting mechanism for output from the chamber. The lifting mechanism may comprise, for example, a servo-driven motor attached to a plurality of lift fingers which minimally contact the bottom surface of the substrate. In some deposition processes, particles on the backside of the substrate may be removed after the deposition process by lifting the substrate to an elevated position and exposing the substrate to a plasma to clean the substrate and remove backside contamination.

In a relatively newly developed method of enhancing transistor performance, the atomic lattice of a deposited material is stressed to improve the electrical properties of the material itself, or of underlying or overlying material that is strained by the force applied by a stressed deposited material. Lattice strain can increase the carrier mobility of semiconductors, such as silicon, thereby increasing the saturation current of the doped silicon transistors to thereby improve their performance. For example, localized lattice strain can be induced in the channel region of the transistor by the deposition of component materials of the transistor which have internal compressive or tensile stresses. For example, silicon nitride materials used as etch stop materials and spacers for the silicide materials of a gate electrode can be deposited as stressed materials which induce a strain in the channel region of a transistor. The type of stress desirable in the deposited material depends upon the nature of the material being stressed. For example, in CMOS device fabrication, negative-channel (NMOS) doped regions are covered with a tensile stressed material having positive tensile stress; whereas positive channel MOS (PMOS) doped regions are covered with a compressive stressed material having negative stress values.

As tensile and compressive stresses are examples of internal loading, they may be regarded as positive and negative values, respectively, of the same type of normal loading. Thus, an unstressed material is neither compressive or tensile. A material may progress from having a compressive stress to becoming more tensile and gradually exhibiting a tensile stress depending on external factors, and vice versa.

Given the stresses created by depositing material on a substrate, it is desirable to control the level of stress generated in the deposited material, as well as change the level of stress after processing steps are complete. A variety of different deposition parameters can control the stress level of a material during deposition, including temperature, and RF power levels among others. Additionally, various techniques have been developed to change the stress of a material already deposited over a substrate including exposure of the substrate to a plasma, exposure of the substrate to ultraviolet light or electron beams, and annealing the deposited layer. Despite the availability of the above techniques, new methods of changing the level of stress of a deposited layer are desirable.

BRIEF SUMMARY OF THE INVENTION

The present invention relates to methods of forming a dielectric layer where the tensile stress of the layer is increased by a plasma treatment at an elevated position. The plasma treatment process described within this invention may be particularly suited for use with a shallow trench isolation process. In one embodiment, an oxide layer and nitride layer are deposited on a substrate and patterned to form a trench opening. A trench is then etched into the substrate, and the substrate is then transferred into a chamber suitable for dielectric deposition. A dielectric layer is then deposited over the substrate, filling the trench and covering the mesa regions adjacent to the trench. The substrate is then raised to an elevated position above the substrate support and exposed to a plasma which increases the tensile stress of the substrate. The substrate is then removed from the dielectric deposition chamber, and portions of the dielectric layer are removed so that the dielectric layer is at a vertical layer even with the topmost portion of the nitride layer. The nitride and pad oxide layers are then removed to form the STI structure.

In some embodiments, the dielectric layer can have a first stress which is compressive, and after plasma treatment, have a second stress which is tensile. In this case, the dielectric layer deposited may have a stress of less than 100 MPa compressive stress. Alternatively, the initially deposited layer can have a first stress which is tensile, and a second stress after deposition which is more tensile than the first stress. The increase in tensile stress exhibited by the deposited layer after plasma treatment can be 100 MPa or more.

In another embodiment, a sputtering process is incorporated after deposition of the dielectric layer, thus exposing the wafer to plasma bombardment that raises the temperature of the wafer. A bias is provided to the substrate which attracts the plasma ions towards the substrate at a greater velocity.

In another embodiment of the invention, a two-step plasma treatment process can be used following deposition whereby the substrate is exposed to an initial plasma treatment at a processing position when the back surface of the substrate is still in contact with the substrate support, and then raised to an elevated position for further treatment.

DETAILED DESCRIPTION OF THE INVENTION

The present invention provides for a method of increasing the tensile stress of a deposited layer on a substrate by treating the substrate with a plasma at an elevated position above the substrate support after the deposition process has concluded. A second embodiment of the invention incorporates a sputtering process prior to plasma treatment by which the temperature of the substrate is increased by exposing the substrate to plasma ion bombardment prior to the plasma treatment process. A bias voltage is provided to the substrate support which attracts the plasma ions toward the substrate, thus causing the ions to impact the top surface of the substrate and raise the temperature of the substrate. Another embodiment of the invention utilizes a two-step plasma treatment process wherein the substrate is first exposed to a plasma at process position immediately following deposition. The plasma is maintained within the chamber during the movement step when the substrate is then raised to an elevated position, and both the top and bottom portions of the substrate are exposed to the plasma.

Semiconductor manufacturers have used various plasma treatment steps to treat dielectric layers deposited on a substrate for a variety of different reasons. Typically, such previously used plasma treatments steps expose the substrate to a plasma while the substrate is positioned directly on top of a substrate support at a processing (e.g., a deposition) position. Embodiments of the invention, however, expose the substrate and deposited dielectric layer to a plasma treatment process while the substrate is positioned above the substrate support. Thus, embodiments of the invention allow the plasma to contact at least a portion of the bottom surface of the substrate in addition to the top surface. The inventors have found that such a technique can be beneficially used to increase the tensile stress of a deposited layer. While not being limited to any particular theory, the inventors believe that exposing both the bottom and top surfaces of the substrate to the plasma enables thermal changes and/or phase shifts in the deposited layer more easy to achieve due to the increased area of exposure to the plasma.

Figure 1:
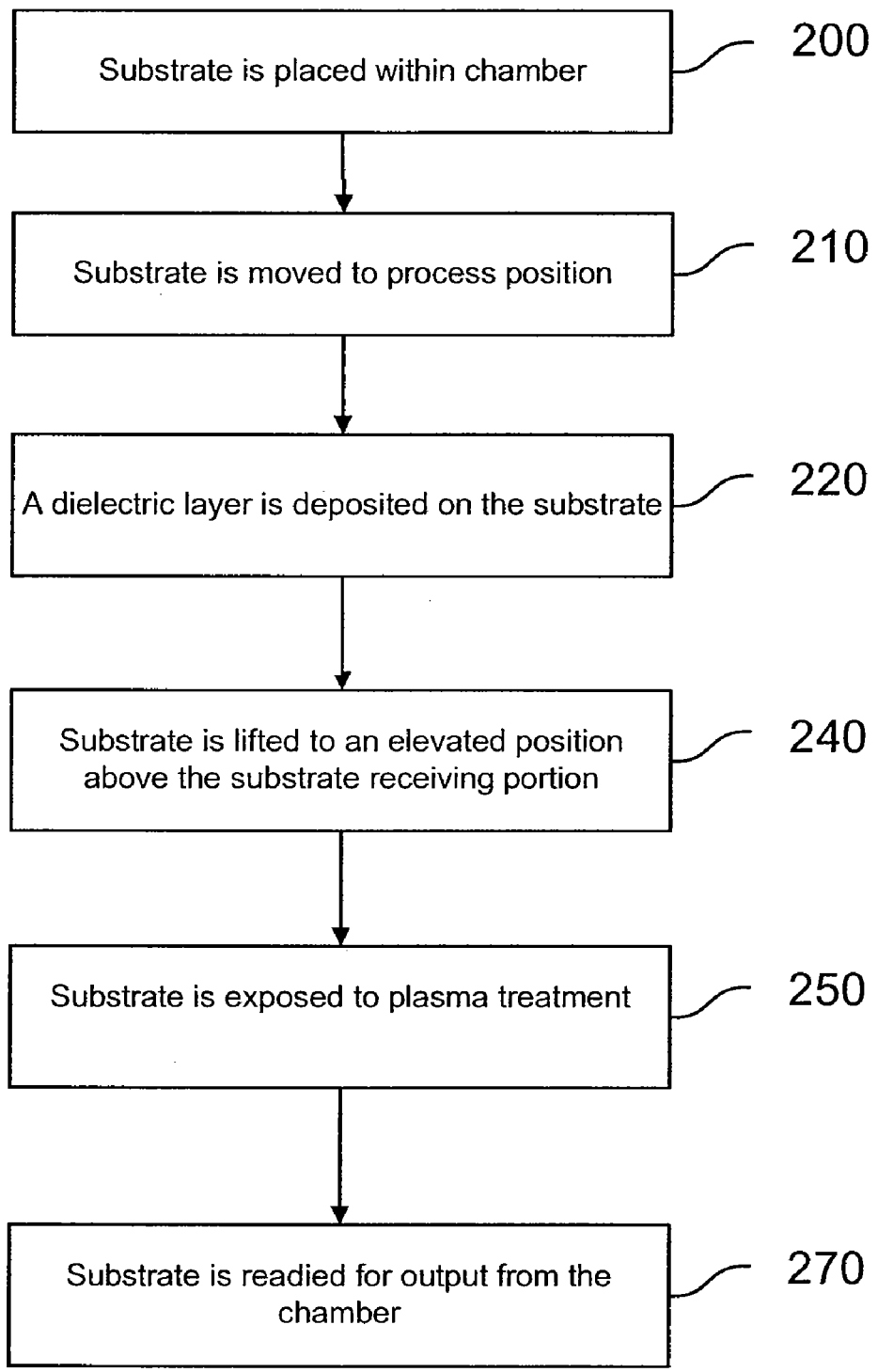
FIG. 1 is a flowchart showing an exemplary process flow used to increase the tensile stress of a dielectric layer.
Figure 2A:
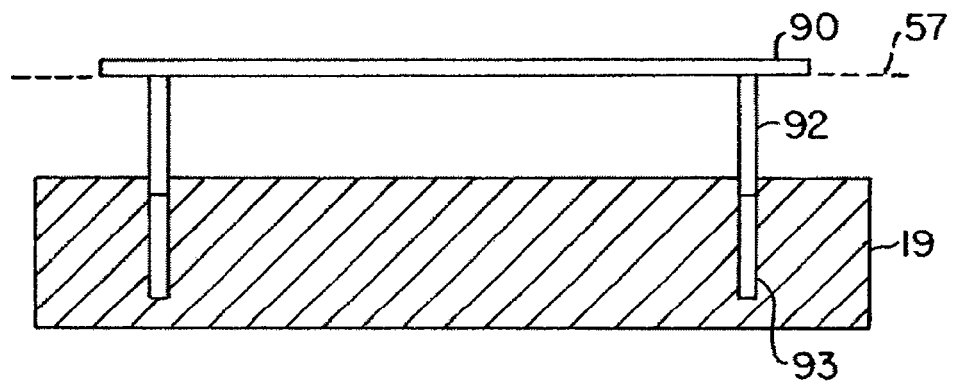
FIG. 2A is a simplified diagram showing the position of a substrate and lift pins in a loading position.
Figure 2B:
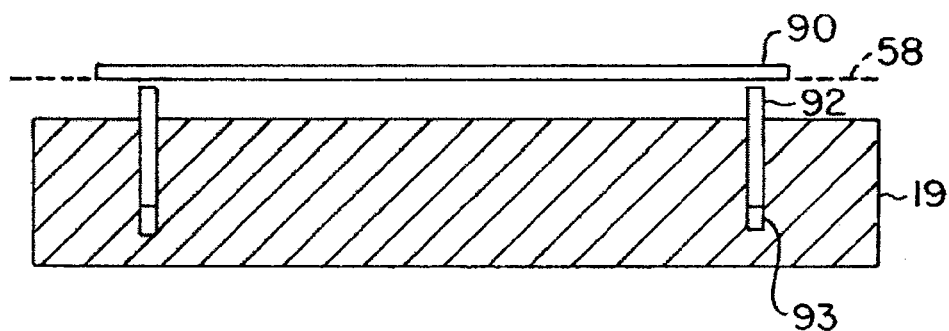
FIG. 2B is a simplified diagram showing the position of a substrate and lift pins in a lift position.
Figure 2C:
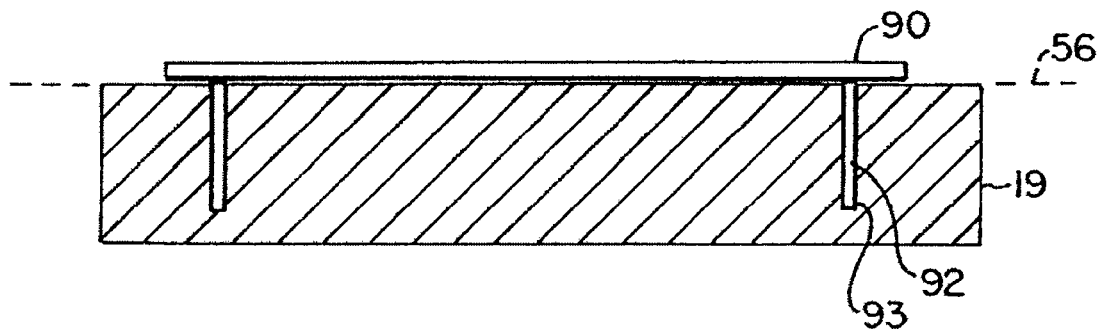
FIG. 2C is a simplified diagram showing the position of a substrate and lift pins in a processing position.

In order to better appreciate and understand the present invention, reference is made to FIG. 1, which is a flowchart depicting the steps associated with an exemplary embodiment of the invention, and FIGS. 2A-2C, which are simplified cross-sectional views of a substrate support and lifting mechanism contained within a substrate processing chamber. The lifting mechanism utilized within this embodiment of the invention is a plurality of lift pins configured to position the substrate on the substrate support. The process discussed below with respect to FIGS. 1 and 2A-2C is for plasma treatment of an undoped silica glass (USG) layer that may be used, for example, in a shallow trench isolation (STI) application. It us to be understood however, that the techniques of the present invention are applicable to other applications such as intermetal dielectric (IMD) layers and premetal dielectric (PMD) among others. Also, techniques of the present invention are applicable to the deposition of a variety of materials using HDP-CVD techniques. These materials, the use of which is application specific, include doped silica glass films, such as phosphorous silica glass (PSG), boron-doped silicate glass (BSG), borophosphosilicate glass (BPSG) and carbon-doped-silica glass (SiOC), silicon nitride, silicon oxynitride, silicon carbon materials (SiC) and others.

An example illustrating the operation of such lift pins is shown in FIG. 2A-2C, where the various components are not shown to scale. The lift pins 92 are adapted to position the substrate 90 in any one of three positions relative to the substrate receiving portion 19. The lift pins 92 may reside within the chambers 93 and be driven with a motor (not shown) such that the three positions are achieved by moving the lift pins 92 out from or into the substrate receiving portion a specific distance. In a first position, shown in FIG. 2A, the lift pins 92 are positioned such that the substrate 90 can be received from the robot blade at the upper loading position 57. The upper loading position 57 is determined so as to be convenient for receiving the substrate 90 from the robot blade. In a second position, the lift position 58 shown in FIG. 2B, the lift pins 92 are further recessed into the substrate receiving portion 19 and positioned so that the substrate 90 is not in contact with the substrate receiving portion 19. The distance between the substrate 90 and the substrate receiving position 19 at lift position 58 can be varied depending on the process used, so long as the substrate 90 and substrate receiving portion 19 are not in contact. In a third position, shown in FIG. 2C as the processing position 56, the lift pins are positioned below the top surface of the substrate support so that the substrate 90 is in contact with the substrate receiving portion 19, where it may be electrostatically chucked into a secure position for processing.

Referring now to FIG. 1, at step 200, the substrate 90 to be processed is transferred into the substrate processing chamber and received at the upper loading position 57, resting on the lift pins 92. At step 210, the substrate 90 is then moved to a processing position 56 by retracting the lift pins 92 so that the back surface of the substrate 90 rests on the substrate receiving portion 19 at a processing position 56, as shown in FIG. 2C. The substrate 90 is now ready for deposition.

In one embodiment of the invention, the process conditions for the deposition step 220 are selected so as to deposit a dielectric layer having an as deposited stress level of between 100 MPa compressive stress (a relatively low compressive stress level) to 50 MPa tensile stress. The inventors have found that exposing dielectric layers having as-deposited stress levels within this range results in a substantial change in the absolute stress level of the dielectric layer (a change of at least 100 mPa in some embodiments and a change of at least 150 MPa in certain other embodiments). According to some embodiments of the invention the plasma treatment described herein is most effective if used on a deposited layer with an initial stress of 0-50 MPa compressive stress or 0-50 MPa tensile stress (i.e., an as-deposited stress of between 50 MPa compressive and 50 MPa tensile).

In contrast, many conventional HDP-CVD deposition methods used to deposit a silicon oxide layers for use as dielectric material in integrated circuits commonly produce relatively highly compressive stress layers of greater than 150 MPa compressive stress. The inventors have found that plasma treatment of dielectric layers having such relatively high compressive stress results in a considerably reduced change in the absolute stress level than if the dielectric layer has an as-deposited stress level within the ranges described above and thus cannot alter the stress level of the layer by a sufficient enough amount to reach the tensile stress levels desirable in some applications.

As would be understood by a person of ordinary skill in the art, several parameters of the deposition process used in step 220 can be altered from values used in conventional HDP-CVD processes to deposit a silicon oxide layer having an as-deposited stress level within the desired 100 MPa compressive stress (a relatively low compressive stress level) to 50 MPa tensile stress. For example, the deposition parameters used in step 220 may differ from the parameters used in a conventional HDP-CVD STI process by using one or more of a lower substrate temperature during deposition, a lower chamber pressure, and/or a lesser amount of source RF power in order to produce a more tensile layer.

Any appropriate deposition process can be employed to deposit the dielectric layer having a desired stress level during step 220. In one particular embodiment, a flow of substantially inert gas is provided to form a plasma above substrate 90. As used herein, "substantially inert gas" refers to a gas or combination of gases that does not result in appreciable deposition during the deposition process. The substantially inert gas may be $O_2$, Ar, He, $H_2$, $N_2$, or a mixture of the previous gases. The specific substantially inert gas that is used is not critical to the process being described, meaning that a similar amount of Ar flow could be substituted for a comparable flow of He, or any other substantially inert gas may be used within this process.

Table 1 below lists the process parameters for deposition step 220 used to create a low tensile stress film as compared to a conventional HDP-CVD deposition parameters implemented in the Ultima HDP-CVD chamber manufactured for Applied Materials and outfitted for 200 mm substrates according to one particular embodiment of the invention. The gas flow rates and other parameters set forth in Table 1 below are optimized for a deposition process run in the Ultima chamber. A person of ordinary skill in the art will recognize that these rates and parameters are in part chamber specific and will vary if chambers of other design and/or volume are employed.

TABLE 1

Exemplary Ranges for Process Parameters

| Parameter | Conventional Deposition | Low Tensile Stress Deposition |
|---|---|---|
| Wafer Position | process - wafer chucked | process - wafer chucked |

TABLE 1-continued

Exemplary Ranges for Process Parameters

| Parameter | Conventional Deposition | Low Tensile Stress Deposition |
|---|---|---|
| Step Duration | 60 s-400 s | 60 s-400 s |
| Chamber Pressure | 4-20 mT | <4 mT (1.0 mT-4 mT) |
| Wafer Temperature | 500-700 deg C. | <500 deg C. (200 C. to 300 C.) |
| ESC Temp Setpoint | 100-300 deg C. | 25-75 deg C. |
| Top Source RF Power | 3-5 kW | 1-4 kW |
| Side Source RF Power | 3-5 kW | 1-4 kW |
| Bias Voltage | 1-4 Kw | 1-4 kW |
| Gas Flow | $SiH_4$, $O_2$, $H_2$, inert gas | $SiH_4$, $O_2$, $H_2$, inert gas |
| Gas flow amounts | $SiH_4$ 20-100 sccm $O_2$ 30-150 sccm | $SiH_4$ 20-100 sccm $O_2$ 30-150 sccm |

After the completion of the deposition process of step 220, the substrate 90 is then moved to an elevated position in step 240 above the substrate receiving portion 19 by extending the lift pins 92. The plasma created during the deposition process 220 is still present above the substrate 90, and is maintained through the substrate movement step 240 by continuing to flow inert gases. Process parameters for step 240 are shown in Table 2. A typical duration of the substrate movement step 240 will last between 1-10 seconds. In an exemplary embodiment, the substrate 90 is lifted to the position 58, where the height that the lift pins 92 are extended may vary from 1 to 50 mm, so long as the back side of the substrate 90 is no longer in contact with the substrate receiving portion 19.

TABLE 2

Exemplary Ranges for Process Parameters

| Parameter | During Substrate Movement | Plasma Treatment |
|---|---|---|
| Substrate Position | substrate is moving | process position |
| Step Duration | 1-10 s | 10-60 s |
| Chamber Pressure | 10 mT | 8-12 mT |
| Substrate Temperature | N/A | >300 deg C. (400 C.-600 C.) |
| ESC Temp Setpoint | N/A | N/A |
| Top Source RF Power | 1-3 kW | 3-8 kW |
| Side Source RF Power | 1-3 kW | 3-8 kW |
| Bias Voltage | N/A | 0 kW |
| Gas Flow | none | inert gas |
| Gas flow Amounts | $O_2$ 200 sccm | $O_2$ 200 sccm Ar 50 sccm He(side) 460 sccm He (top) 500 sccm |

The substrate 90 is now situated above the substrate receiving portion 19 on the lift pins 92 for plasma treatment in step 250. Plasma treatment of the substrate 90 in an elevated position induces a change in the stress of the deposited layer not seen when plasma treatment of the substrate occurs at a processing position. By raising the substrate 90 to an elevated position above the substrate receiving portion 19, both the deposited layer on the top surface of the substrate 90 as well as the bottom surface of the substrate 90 are exposed to the plasma. The duration of exposure to the plasma is a period greater than 10 seconds, but optimally 30-60 seconds in step 250. Process parameters for step 250 are shown within Table 2. The inventors have found that even if the distance between the substrate 90 and substrate receiving portion 19 is only 1 mm, the plasma present during step 250 will occupy the gap between the substrate 90 and substrate receiving portion 19 and treat both the top and bottom sides of the substrate 90.

While not being limited to any particular theory, this exposure of both the top and bottom surface of the substrate 90 causes a shift in the chemical component and phase of the deposited layer, as well as a change in the temperature profile of both the deposited layer and substrate. This contrasts with the use of plasma treatment at a non-elevated position, in which only the top surface of the deposited layer was exposed to the plasma treatment. Additionally, a greater amount of moisture content present within the deposited layer is driven out by the plasma treatment at an elevated position. Shrinkage of the deposited layer occurs, thus causing the layer to become thinner and more dense as the excess moisture is removed. The exposure of the deposited layer to plasma in an elevated position results in the stress of the layer increasing more than 100 MPa in the tensile direction, meaning that a low compressive stress layer may be altered to exhibit a low tensile stress, or a low tensile stress layer may be altered to exhibit a high tensile stress. In particular, changes of nearly 150 MPa in the stress of a deposited layer have been exhibited after plasma treatment according to this invention.

Without being limited by an explanation, one possible reason that a higher tensile stress layer can be formed by the exemplary plasma treatment described herein is that a layer having higher stress values can be obtained by reducing the net hydrogen content, or the amount of silicon-hydrogen bonds (Si—H bonds) in the deposited layer. It is believed that lower hydrogen content in the deposited layer, which results in a detectably smaller amount of Si—H bonds in the as-deposited layer, gives rise to higher tensile stress values in the deposited layer. The use of a plasma treatment of a deposited layer on a substrate can be used to achieve lower hydrogen content in the deposited layer, and thus increase the tensile stress of the substrate.

At the conclusion of the plasma treatment process, the plasma is extinguished by stopping the flow of inert gas and the substrate 90 is readied for output in step 270 by being raised to upper loading position 57. The vertical position of the substrate 90 is changed by raising the lift pins 92 to allow a robot blade (not shown) to remove the substrate 90 from the chamber.

Embodiments of the present invention can be implemented using a variety of high density plasma CVD substrate processing chambers including chambers in which a plasma is formed by the application of RF energy to a coil that at least partially surrounds a portion of the chamber and chambers that use ECR plasma formation techniques. An example of an inductively-coupled HDP-CVD chamber in which embodiments of the method of the present invention can be practiced is set forth below.

Figure 3A:
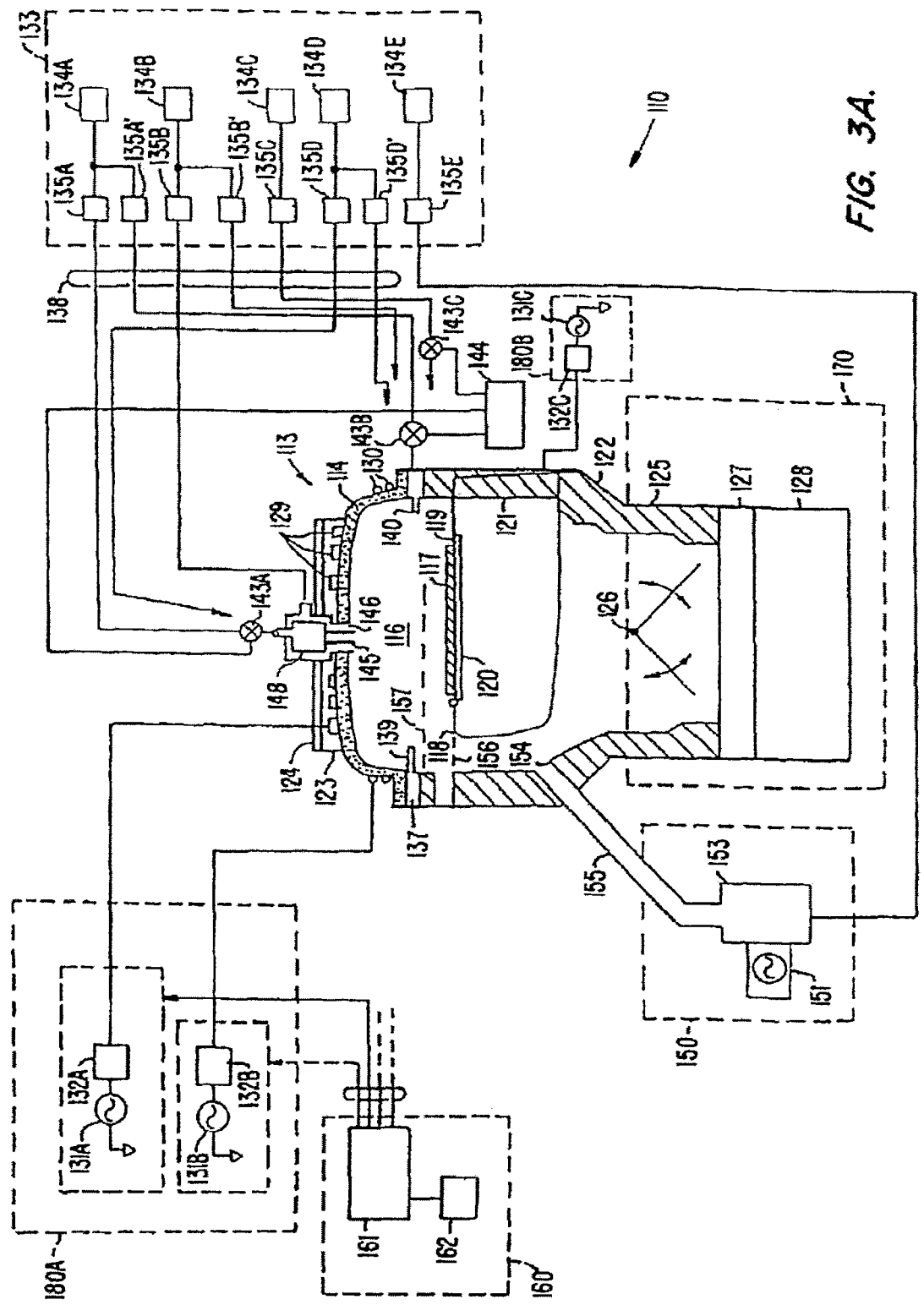
FIG. 3A is a simplified diagram of one embodiment of a high-density plasma chemical vapor deposition system according to the present invention.

FIG. 3A illustrates one embodiment of a high density plasma chemical vapor deposition (HDP-CVD) system 110 in which a substrate can be processed according to the present invention. System 110 includes a chamber 113, a vacuum system 170, a source plasma system 180A, a bias plasma system 180B, a gas delivery system 133, and a remote plasma cleaning system 150.

The upper portion of chamber 113 includes a dome 114, which is made of a ceramic dielectric material, such as aluminum oxide or aluminum nitride. Dome 114 defines an upper boundary of a plasma processing region 116. Plasma processing region 116 is bounded on the bottom by the upper surface of a substrate 117 and a substrate support member 118.

A heater plate 123 and a cold plate 124 surmount, and are thermally coupled to, dome 114. Heater plate 123 and cold plate 124 allow control of the dome temperature to within about +−10 degrees C. over a range of about 100 degrees C. to 200 degrees C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 113 includes a body member 122, which joins the chamber to the vacuum system. A base portion 121 of substrate support member 118 is mounted on, and forms a continuous inner surface with, body member 122. Substrates are transferred into and out of chamber 113 by a robot blade (not shown) through an insertion/removal opening (not shown) in the side of chamber 113. Lift pins (shown in FIG. 2) are raised and then lowered under the control of a motor (not shown) to move the substrate to different positions within the chamber 13. The lift pins may be configured to move the substrate from the robot blade at an upper loading position 57 to a position 58 where, as explained further below, the substrate is prepared for processing. Subsequently, the lift pins may move the substrate to a lower processing position 56 in which the substrate is placed on a substrate receiving portion 119 of substrate support member 118. Substrate receiving portion 119 includes an electrostatic chuck 120 that secures the substrate to substrate support member 118 during substrate processing. In a preferred embodiment, substrate support member 118 is made from an aluminum oxide or aluminum ceramic material.

Vacuum system 170 includes throttle body 125, which houses twin-blade throttle valve 126 and is attached to gate valve 127 and turbo-molecular pump 128. It should be noted that throttle body 125 offers minimum obstruction to gas flow, and allows symmetric pumping. Gate valve 127 can isolate pump 128 from throttle body 125, and can also control chamber pressure by restricting the exhaust flow capacity when throttle valve 126 is fully open. The arrangement of the throttle valve, gate valve, and turbo-molecular pump allow accurate and stable control of chamber pressures from between about 1 millitorr to about 2 torr.

The source plasma system 180A includes a top coil 129 and side coil 130, mounted on dome 114. A symmetrical ground shield (not shown) reduces electrical coupling between the coils. Top coil 129 is powered by top source RF (SRF) generator 131A, whereas side coil 130 is powered by side SRF generator 131B, allowing independent power levels and frequencies of operation for each coil. This dual coil system allows control of the radial ion density in chamber 113, thereby improving plasma uniformity. Side coil 130 and top coil 129 are typically inductively driven, which does not require a complimentary electrode. In a specific embodiment, the top source RF generator 131A provides up to 5,000 watts of RF power at nominally 2 MHz and the side source RF generator 131B provides up to 5,000 watts of RF power at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency.

A bias plasma system 180B includes a bias RF("BRF") generator 131C and a bias matching network 132C. The bias plasma system 180B capacitively couples substrate portion 117 to body member 122, which act as complimentary electrodes. The bias plasma system 180B serves to enhance the transport of plasma species (e.g., ions) created by the source plasma system 180A to the surface of the substrate. In a specific embodiment, bias RF generator provides up to 5,000 watts of RF power at 13.56 MHz.

RF generators 131A and 131B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 132A and 132B match the output impedance of generators 131A and 131B with their respective coils 129 and 130. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 3B:
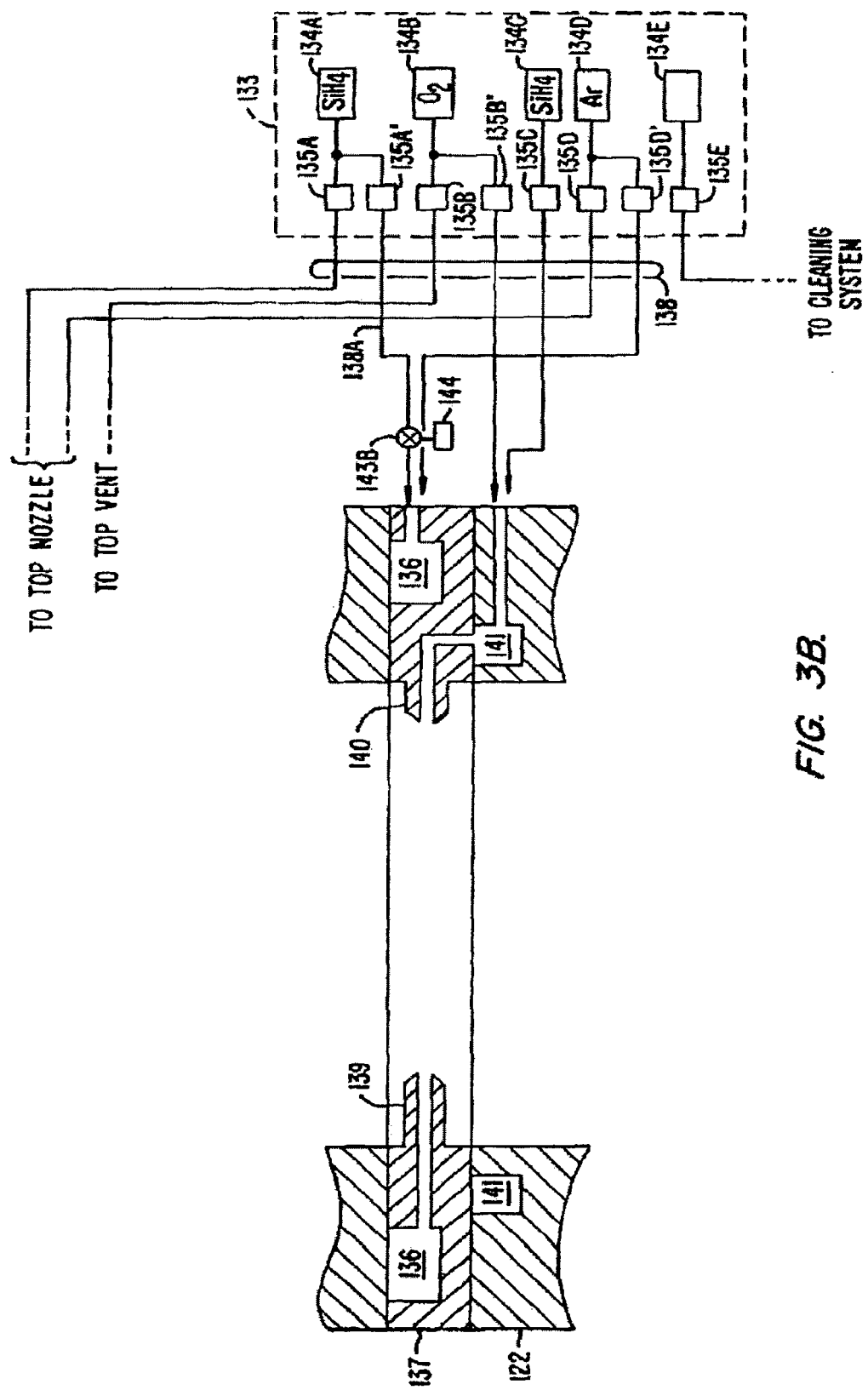
FIG. 3B is a simplified cross section of a gas ring that may be used in conjunction with the exemplary CVD processing chamber of FIG. 1A.

A gas delivery system 133 provides gases from several sources 134A-134E to the chamber for processing the substrate via gas delivery lines 138 (only some of which are shown). As would be understood by a person of skill in the art, the actual sources used for sources 134A-134E and the actual connection of delivery lines 138 to chamber 113 varies depending on the deposition and cleaning processes executed within chamber 113. Gases are introduced into chamber 113 through a gas ring 137 and/or a top nozzle 145. FIG. 3B is a simplified, partial cross-sectional view of chamber 113 showing additional details of gas ring 137.

In one embodiment, first and second gas sources, 134A and 134B, and first and second gas flow controllers, 135A' and 135B', provide gas to ring plenum 136 in gas ring 137 via gas delivery lines 138 (only some of which are shown). Gas ring 137 has a plurality of source gas nozzles 139 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 137 has 12 source gas nozzles made from an aluminum oxide ceramic.

Gas ring 137 also has a plurality of oxidizer gas nozzles 140 (only one of which is shown), which in a preferred embodiment are co-planar with and shorter than source gas nozzles 139, and in one embodiment receive gas from body plenum 141. In some embodiments it is desirable not to mix source gases and oxidizer gases before injecting the gases into chamber 113. In other embodiments, oxidizer gas and source gas may be mixed prior to injecting the gases into chamber 113 by providing apertures (not shown) between body plenum 141 and gas ring plenum 136. In one embodiment, third and fourth gas sources, 134C and 134D, and third and fourth gas flow controllers, 135C and 135D', provide gas to body plenum via gas delivery lines 138. Additional valves, such as 143B (other valves not shown), may shut off gas from the flow controllers to the chamber.

In embodiments where flammable, toxic, or corrosive gases are used, it may be desirable to eliminate gas remaining in the gas delivery lines after a deposition.

This may be accomplished using a 3-way valve, such as valve 143B, to isolate chamber 113 from delivery line 138A and to vent delivery line 138A to vacuum foreline 144, for example. As shown in FIG. 3A, other similar valves, such as 143A and 143C, may be incorporated on other gas delivery lines. Such 3-way valves may be placed as close to chamber 113 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 3A, chamber 113 also has top nozzle 145 and top vent 146. Top nozzle 145 and top vent 146 allow independent control of top and side flows of the gases, which improves layer uniformity and allows fine adjustment of the layer's deposition and doping parameters. Top vent 146 is an annular opening around top nozzle 145. In one embodiment, first gas source 134A supplies source gas nozzles 139 and top nozzle 145. Source nozzle MFC 135A' controls the amount of gas delivered to source gas nozzles 139 and top nozzle MFC 135A controls the amount of gas delivered to top gas nozzle 145. Similarly, two MFCs 135B and 135B' may be used to control the flow of oxygen to both top vent 146 and oxidizer gas nozzles 140 from a single source of oxygen, such as source 134B. The gases supplied to top nozzle 145 and top vent 146 may be kept separate prior to flowing the gases into chamber 113, or the gases may be mixed in top plenum 148 before they flow into chamber 113. Separate sources of the same gas may be used to supply various portions of the chamber.

A remote microwave-generated plasma cleaning system 150 is provided to periodically clean deposition residues from chamber components. The cleaning system includes a remote microwave generator 151 that creates a plasma from a cleaning gas source 134E (e.g., molecular fluorine, nitrogen trifluoride, other fluorocarbons or equivalents) in reactor cavity 153. The reactive species resulting from this plasma are conveyed to chamber 113 through cleaning gas feed port 154 via applicator tube 155. The materials used to contain the cleaning plasma (e.g., cavity 153 and applicator tube 155) must be resistant to attack by the plasma. The distance between reactor cavity 153 and feed port 154 should be kept as short as practical, since the concentration of desirable plasma species may decline with distance from reactor cavity 153. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 120, do not need to be covered with a dummy wafer or otherwise protected, as may be required with an in situ plasma cleaning process. In one embodiment, this cleaning system is used to dissociate atoms of the etchant gas remotely, which are then supplied to the process chamber 113. In another embodiment, the etchant gas is provided directly to the process chamber 113. In still a further embodiment, multiple process chambers are used, with deposition and etching steps being performed in separate chambers.

System controller 160 controls the operation of system 110. In a preferred embodiment, controller 160 includes a memory 162, such as a hard disk drive, a floppy disk drive (not shown), and a card rack (not shown) coupled to a processor 161. The card rack may contain a single-board computer (SBC) (not shown), analog and digital input/output boards (not shown), interface boards (not shown), and stepper motor controller boards (not shown). The system controller conforms to the Versa Modular European ("VME") standard, which defines board, card cage, and connector dimensions and types. The VME standard also defines the bus structure as having a 16-bit data bus and 24-bit address bus. System controller 160 operates under the control of a computer program stored on the hard disk drive or through other computer programs, such as programs stored on a removable disk. The computer program dictates, for example, the timing, mixture of gases, RF power levels and other parameters of a particular process.

Figure 4:
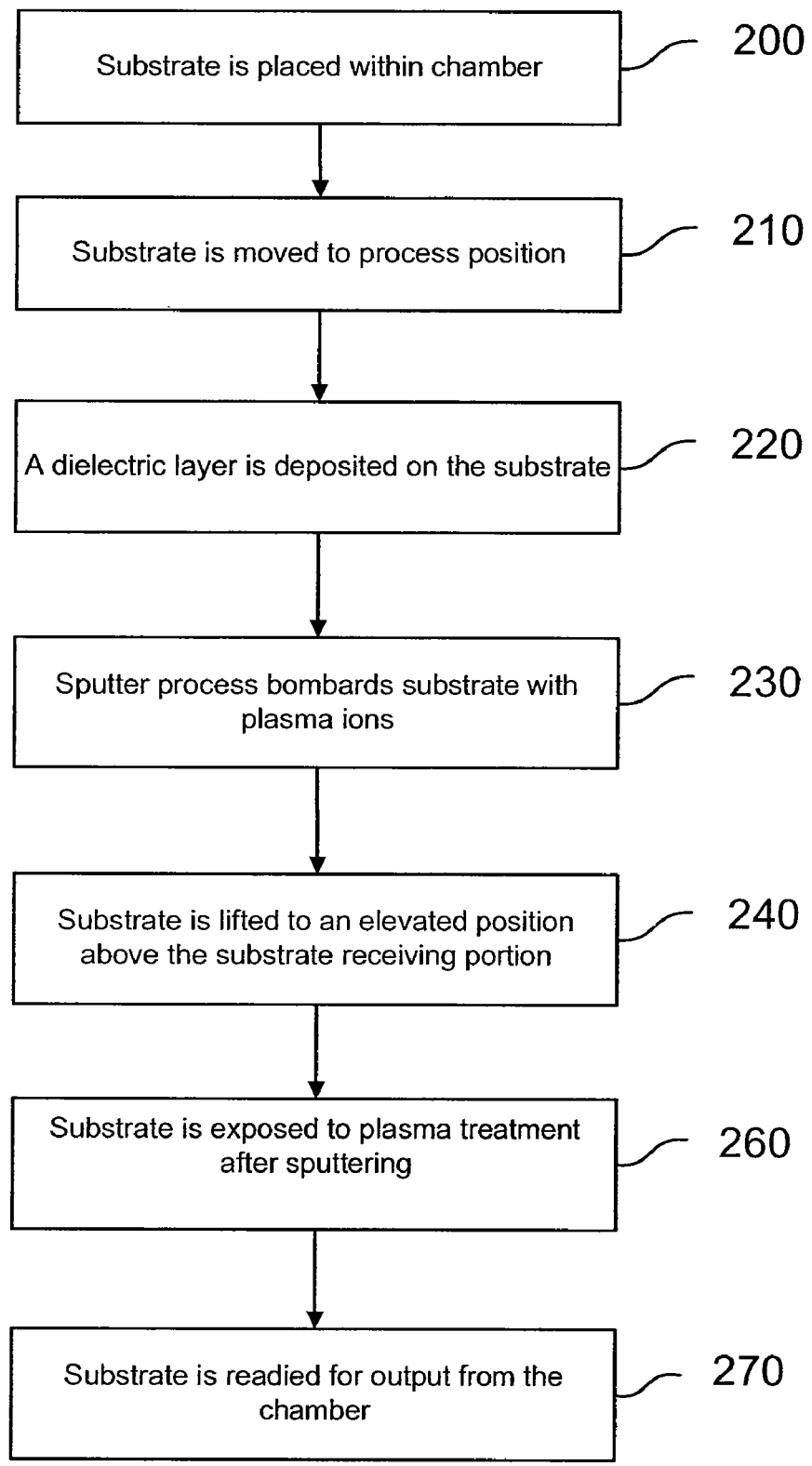
FIG. 4 is a flowchart showing an alternate process flow used to increase the tensile stress of a dielectric layer using a sputtering process after deposition.

In an alternate embodiment of the invention shown in FIG. 4, a sputter step 230 may be performed after the completion of the deposition step 220 while the substrate 90 is still at the processing position 56. Steps 200-220 are performed in accordance with the description of those steps for FIG. 1. The plasma formed within the previous deposition step 220 is maintained by continuing to flow a substantially inert gas while also providing RF power through the top coil 129 and side coils 130. Gaseous ions within the plasma are attracted towards the biased substrate receiving portion 119 and bombard the deposited layer on the substrate, thus raising the temperature of the substrate 90 to a temperature of between 400-700 degrees C. This temperature increase occurs primarily due to heat transfer from the charged plasma ions impacting the deposited layer on top of the substrate 90. A small amount of the deposited material may be etched away during the sputter process, but the amount is minimal and may be compensated for by adjusting the deposition recipe. The pressure during the sputter step is maintained as a stable pressure, with an exemplary chamber pressure existing between 5 to 9 mT. The duration of the sputter step 230 in an exemplary embodiment is between 15 and 45 seconds. Exemplary process parameters for steps 220-260 of the invention are shown in Table 3.

TABLE 3

Exemplary Ranges for Process Parameters

| Parameter | During Deposition | Sputtering | During Substrate Movement | Plasma Treatment |
|---|---|---|---|---|
| Substrate Position | process - substrate chucked | process | substrate is moving | lift position |
| Step Duration | 60 s-400 s | 15-45 s | 1-10 s | 15-45 s |
| Chamber Pressure | <4 mT (1.0 mT-4 mT) | 5-9 mT | 10 mT | 5-9 mT |
| Substrate Temperature | <500 deg C. (200 C. to 300 C.) | 400 C.-700 C. | N/A | >300 deg C. (400 C.-600 C.) |
| ESC Temp setpoint | 25-75 deg C. | 25-75 deg C. | N/A | N/A |
| Top Source RF Power | 1-4 kW | 1-3 kW | 1-3 kW | 1-3 kW |
| Side Source RF Power | 1-4 kW | 1-3 kW | 1-3 kW | 1-3 kW |
| Bias Voltage | 1-4 kW | 3.5 kW | N/A | N/A |
| Gas Flow | $SiH_4$, $O_2$, $H_2$, inert gas | inert gas | inert gas | inert gas |
| Gas flow Amounts | $SiH_2$ 20-100 sccm $O_2$ 30-150 sccm | $O_2$ 20 sccm He (side) 460 sccm He (top) 460 sccm | $O_2$ 200 sccm | $O_2$ 200 sccm He (side) 460 sccm He (top) 460 sccm |

After the sputter step 230 is complete, the plasma present during sputtering is maintained throughout the movement of the substrate 90 to an elevated position in step 240. Due to the added sputter step 230, the substrate temperature has already been raised to a higher temperature and the process parameters for plasma treatment step after sputtering 260 can be different than if performed without a sputter step 230. For example, while the process conditions are similar to that of plasma treatment step 250 performed without a sputter step, a shorter duration of between 15-45 seconds may be utilized in plasma treatment after sputtering 260, along with a chamber pressure of 5-9 mT. Additionally, in one embodiment the amount of RF power delivered to the top 129 and side coils 130 delivered is a reduced amount of 1-3 kW. The substrate is then readied for output in step 270.

Figure 5:
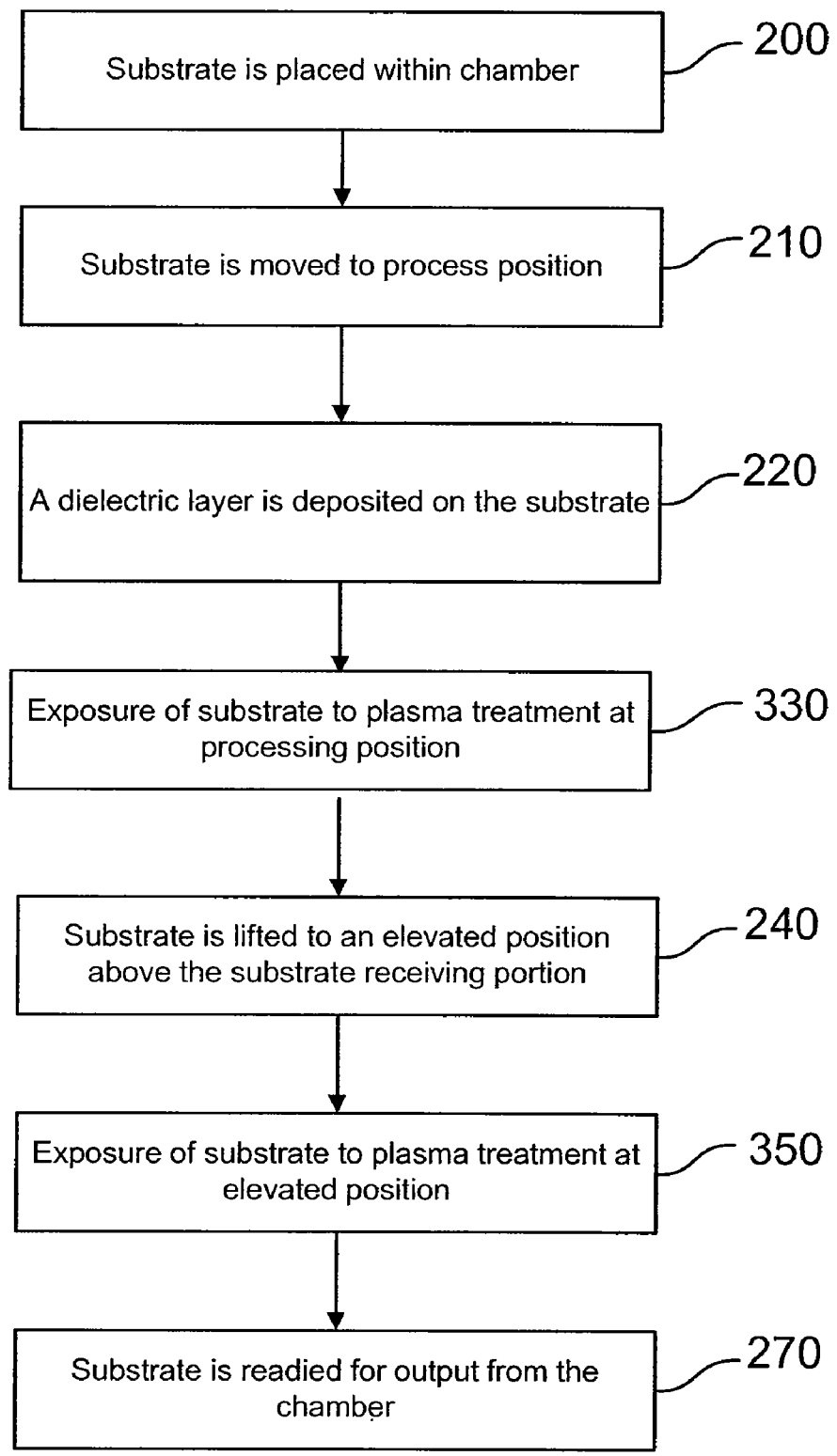
FIG. 5 is a flowchart showing an alternate process flow used to increase the tensile stress of a dielectric layer by using a two-step plasma treatment process.

In an alternate embodiment of the invention, a two-step plasma treatment process is used to treat the substrate 90, as shown in FIG. 5. The substrate is placed within the chamber, moved to process position 56, and a dielectric layer is deposited as in steps 200-220. Following the deposition of a dielectric layer on a substrate 90 in step 220, the plasma created in step 220 is maintained while the substrate 90 is kept at processing position 56 to treat the substrate 90 with a plasma for a duration of at least 10 seconds in step 330. The process conditions of step 330 are similar to those used in step 250, except that the duration of the plasma treatment at the process position may be shorter due to the two-step nature of the plasma treatment. The process parameters for the two-step plasma treatment process are shown in Table 4. Subsequently, the substrate is lifted to an elevated position above the substrate receiving position 119 in step 240 and both the deposited layer and bottom of the substrate 90 are then exposed to a plasma in step 350 for a duration between 10-40 seconds at a pressure of between 8-12 mT. A reduced amount of RF power is applied to the top 129 and side 130 RF coils of between 1-4 kW is used to maintain the plasma. The temperature of the substrate is maintained at a temperature between 300-600 degrees C., and gas flows of 300-600 sccm He to both the side source 139 and top 145 nozzles are provided, in addition to gas flows of 100-300 sccm $O_2$ and 25-100 sccm Ar. This approach can also yield a tensile stress of 100 MPa greater than the original stress of the substrate prior to treatment. The substrate is then readied for output in step 270.

TABLE 4

Exemplary Ranges for Process Parameters

| Parameter | During Deposition | Plasma Treatment | During Substrate Movement | Plasma Treatment |
|---|---|---|---|---|
| Substrate Position | process - substrate chucked | process position | substrate is moving | lift position |
| Step Duration | 60 s-400 s | 10-40 s | 1-10 s | 10-40 s |
| Chamber Pressure | <4 mT (1.0 mT-4 mT) | 8-12 mT | 8-12 mT | 8-12 mT |
| Substrate Temperature | <500 deg C. (200 C. to 300 C.) | >300 deg C. (400 C.-600 C.) | 1-3 kW | >300 deg C. (400 C.-600 C.) |
| ESC Temp setpoint | 25-75 deg C. | N/A | 1-3 kW | N/A |
| Top Source RF Power | 1-4 kW | 3-8 kW | 2 kW | 1-4 kW |
| Side Source RF Power | 1-4 kW | 3-8 kW | 2 kW | 1-4 kW |
| Bias Voltage | 1-4 kW | 0 Kw | N/A | 0 kW |
| Gas Flow | $SiH_4$, $O_2$, $H_2$, inert gas | inert gas | none | inert gas |
| Gas flow Amounts | $SiH_4$ 20-100 sccm $O_2$ 30-150 sccm | $O_2$ 200 sccm Ar 50 sccm He(side) 460 sccm He (top) 460 sccm | $O_2$ 200 sccm | $O_2$ 200 sccm Ar 50 sccm He(side) 460 sccm He (top) 460 sccm |

In another embodiment of the invention, a discontinuous plasma treatment is used to treat the substrate 90 following the deposition process. After a dielectric layer has been deposited on the substrate, the plasma created during deposition is maintained for a period of time while the substrate 90 is still positioned on the substrate receiving portion 119 at processing position 56. In this particular embodiment, the period of time that the substrate is exposed to plasma is a period between 30-60 seconds, but may also be longer or shorter depending on the type of dielectric being deposited. Following the initial plasma treatment, the plasma is turned off by stopping the flow of gases into the chamber. The substrate is then moved to a lift position 58 during a substrate movement step 240 by raising lift pins 92 to a height above the substrate receiving portion 19. A plasma is then reformed by flowing inert gases into the chamber and applying RF energy through the side and top coils. The plasma treats both the top and bottom sides of the elevated substrate, thus changing the stress of the wafer to become more tensile.

The techniques described in various embodiments of the current invention can be advantageously used within many different process applications, such as a shallow trench isolation (STI) application. The use of a plasma treatment within an STI application is shown in FIGS. 6A-6E and described in more detail below. Several of the steps may occur within a series of different chambers, but the deposition of the dielectric layer and plasma treatment process occur within one chamber.

Figure 6A:
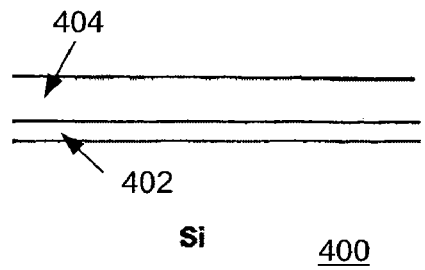
FIGS. 6A-6E are a series of diagrams showing a typical process flow for a shallow trench isolation (STI) process.
Figure 6B:
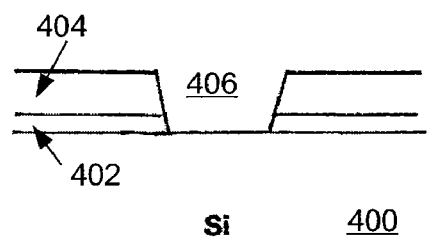
Figure 6C:
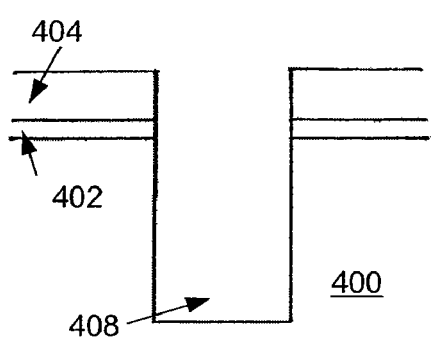
Figure 6D:
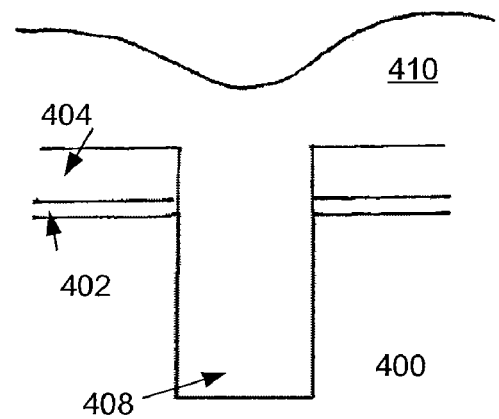
Figure 6E:
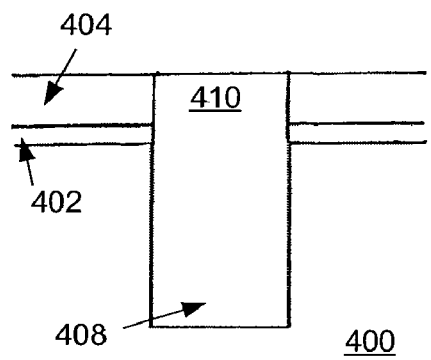

A thin pad oxide 402 is first grown or deposited on a silicon substrate 400, and a nitride layer 404 is deposited over the layer of pad oxide 402, as shown in FIG. 6A. The nitride layer 404 is used as an etch-stop layer and acts as a hard mask for the trench etch steps. Following deposition, a lithography process is implemented to form a photoresist mask and pattern a trench opening 406 in the pad oxide and nitride layers, shown in FIG. 6B. A nitride etch and silicon etch are used to create a deep trench 408 within the silicon. This is shown in FIG. 6C. After removal of the photoresist mask, the substrate 400 is then moved to a substrate processing chamber 13 and moved into a processing position 56. A dielectric layer 410 is then deposited on the substrate 400, filling both the trench region and mesa regions adjacent to the trench 408. The result of the dielectric deposition process is shown in FIG. 6D. The substrate 400 is then raised by a lifting mechanism such as lift pins to an elevated position. The plasma created during deposition is maintained throughout this process. The substrate 400 is then exposed to the plasma for a given duration, affecting both the top and bottom of the substrate. After extinguishing the plasma, the substrate is readied for output from the chamber. Process conditions for the plasma treatment step can be found in Tables 1 and 2. Following the plasma treatment process, a CMP process is used to remove excess portions of the dielectric layer 410 formed during the deposition step as shown in FIG. 6E. Following the removal of portions of the dielectric layer, a nitride and pad oxide strip is used to remove the nitride 404 and pad oxide layers 402 from the trench, as shown in FIG. 6E. This leaves the trench 408 filled with a dielectric material 410 with a silicon area present between adjacent trenches that can be used for transistor formation. In an alternative process flow, a sputter step can also be incorporated after deposition whereby plasma ions are attracted to the biased substrate.

Having described several embodiments, it will be recognized by those of skill in the art that various modifications, alternative constructions, and equivalents may be used without departing from the spirit of the invention. In particular, while embodiments have been described in detail for high-density plasma system, those of skill in the art will recognize the general applicability of the invention to any substrate processing system that uses a plasma to treat the substrate. For example, while the invention described with respect to an undoped silicate glass layer, the invention can also be used to improve the tensile stress of phosphosilicate glass (PSG), boron-doped silicate glass (BSG), boron phosphosilicate glass (BPSG) layers and fluorine-doped silicon glass (FSG) as well as other types of materials. Also, in other embodiments, silicon sources other than monosilane may be used. Examples of suitable silicon sources include other silane family members such as, $Si_2H_6$, $Si_3H_8$, etc.; TEOS and $SiF_4$ among others. As such, the above description is illustrative and not restrictive. A person of ordinary skill in the art will recognize that the exemplary ranges and process parameters described herein are experimentally determined and further modifications to these values may be possible with further experimentation. Accordingly, the above description should not be taken as limiting the scope of the invention, which is defined in the following claims.

What is claimed is:

1. A method of creating a shallow trench isolation area on a substrate comprising:
   depositing an oxide layer on the substrate;
   depositing a nitride layer on the substrate and patterning the nitride layer to form a trench opening;
   etching a trench into the substrate at the trench opening;
   transferring the substrate into a substrate processing chamber and placing the substrate on a substrate support;
   depositing a dielectric layer over the substrate, filling the trench and covering the portions of the nitride layer adjacent to the trench;
   raising the substrate above the substrate support;
   exposing the substrate to a plasma that increases the tensile stress of the deposited dielectric layer;
   transferring the substrate out of the substrate processing chamber;
   removing portions of the dielectric layer to leave the dielectric layer even with the topmost nitride layer; and
   removing the nitride and pad oxide layers.

2. The method of claim 1 wherein the dielectric layer when deposited has a stress of less than 100 MPa compressive stress.

3. The method of claim 1 wherein the increase in tensile stress of the dielectric layer is at least 100 MPa.

4. The method of claim 1 further comprising:
   after depositing the dielectric layer and prior to raising the substrate, exposing the substrate to an initial plasma treatment while the back surface of the substrate is still in contact with the substrate support.

5. The method of claim 1 wherein the dielectric layer has a first stress which is compressive, and after exposure to the plasma, has a second stress which is tensile.

6. The method of claim 1 wherein the dielectric layer has a first stress which is tensile, and after exposure to the plasma, has a second stress which is more tensile than the first stress.

7. The method of claim 1 wherein the substrate is raised above the substrate support by a plurality of lift pins that extend through the substrate support.

8. The method of claim 1 wherein the substrate and the dielectric layer are heated to a temperature greater than 300 degrees Celsius as a result of exposure to the plasma treatment.

9. The method of claim 1 wherein the dielectric layer is a layer of undoped silicon glass.

10. The method of claim 1 further comprising:
    prior to raising the substrate, exposing the substrate to a sputtering step that increases a substrate temperature.

11. The method of claim 10 wherein the plasma is continuously maintained between the step of exposing the substrate to a sputtering process and exposing the substrate to the plasma.

12. A method of creating a shallow trench isolation area on a substrate, the method comprising:
    forming an oxide layer on the substrate;
    forming a nitride layer over the oxide layer and patterning the nitride layer to form an opening;
    etching the substrate through the opening to form a trench in the substrate;
    transferring the substrate into a substrate processing chamber and placing the substrate on a substrate support, and while the substrate is in the processing chamber;
        depositing a dielectric layer over the substrate using a plasma deposition process, the dielectric layer filling the trench;
        while maintaining plasma created during the plasma deposition process, raising the substrate above the substrate support; and
        in the elevated position, exposing the substrate to the plasma to increase the tensile stress of the deposited dielectric layer.

13. The method of claim 12 further comprising:
    after depositing the dielectric layer and prior to raising the substrate, exposing the substrate to an initial plasma treatment while the back surface of the substrate is still in contact with the substrate support.

14. The method of claim 12 further comprising:
    prior to raising the substrate, exposing the substrate to a sputtering step that increases a substrate temperature.

15. The method of claim 12 wherein the increase in tensile stress of the dielectric layer is at least 100 MPa.

16. The method of claim 12 wherein the dielectric layer has a first stress which is compressive, and after exposure to the plasma, has a second stress which is tensile.

17. A method of creating a shallow trench isolation area on a substrate, the method comprising:
    forming an oxide layer on the substrate;
    forming a nitride layer over the oxide layer and patterning the nitride layer to form an opening;
    etching the substrate through the opening to form a trench in the substrate;
    transferring the substrate into a substrate processing chamber and placing the substrate on a substrate support;
    depositing a dielectric layer over the substrate using a high density plasma CVD deposition process, the dielectric layer filling the trench;
    exposing the substrate to a high density plasma while biasing the substrate, wherein the high density plasma consists of substantially inert gas and exposure to the high density plasma increases a temperature of the substrate to between 400-700° C.; thereafter
    raising the substrate above the substrate support; and
    while the substrate is raised above the substrate support, exposing the substrate to a second high density plasma to increase the tensile stress of the dielectric layer.

18. The method of claim 17 wherein a plasma is continuously maintained between the step of exposing the substrate to the high density plasma and exposing the substrate to the second high density plasma.

19. The method of claim 17 wherein the increase in tensile stress of the dielectric layer is at least 100 MPa.

20. The method of claim 17 wherein the dielectric layer has a first stress which is compressive, and after exposure to the plasma, has a second stress which is tensile.

* * * * *